(12) United States Patent
Matsui

(10) Patent No.: US 7,392,444 B2
(45) Date of Patent: Jun. 24, 2008

(54) NON-VOLATILE MEMORY EVALUATING METHOD AND NON-VOLATILE MEMORY

(75) Inventor: Noriyuki Matsui, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 265 days.

(21) Appl. No.: 10/898,958

(22) Filed: Jul. 27, 2004

(65) Prior Publication Data

US 2005/0210344 A1 Sep. 22, 2005

(30) Foreign Application Priority Data

Mar. 18, 2004 (JP) .............................. 2004-077649

(51) Int. Cl.
*G11C 29/00* (2006.01)

(52) U.S. Cl. .................... 714/718; 365/201; 365/218; 365/185; 365/226; 714/721; 714/723; 714/745; 324/765; 324/760; 324/685; 324/670; 711/4; 360/75

(58) Field of Classification Search ................ 714/718, 714/720, 721, 738
See application file for complete search history.

(56) References Cited

U.S. PATENT DOCUMENTS

| | | | | |
|---|---|---|---|---|
| 4,742,491 A * | 5/1988 | Liang et al. | ............. | 365/185.29 |
| 5,010,028 A * | 4/1991 | Gill et al. | ..................... | 438/263 |
| 5,107,498 A * | 4/1992 | Hagihara et al. | ............... | 714/36 |
| 5,287,313 A | 2/1994 | Okajima | | |
| 5,581,510 A * | 12/1996 | Furusho et al. | ............. | 365/201 |
| 5,710,515 A * | 1/1998 | Teggatz et al. | .............. | 324/763 |
| 5,870,407 A * | 2/1999 | Hsia et al. | .................... | 714/718 |
| 5,895,443 A * | 4/1999 | Gross et al. | .................. | 702/120 |
| 5,953,255 A * | 9/1999 | Lee | ......................... | 365/185.29 |

(Continued)

FOREIGN PATENT DOCUMENTS

JP 5-205491 8/1993

(Continued)

OTHER PUBLICATIONS

Simulation of hot hole currents in ultra-thin silicon dioxides: The relationship between time to breakdown and hot hole currents T. Ezaki, H. Nakasato, T. Yamamoto, and M. Hane Silicon Systems Research Laboratories, System Devices and Fundamental Research, NEC Corporation, 1120 Shimokuzawa, Sagamihara, 229-1198, Japan.*

(Continued)

*Primary Examiner*—Cynthia Britt
*Assistant Examiner*—Merant Guerrier
(74) *Attorney, Agent, or Firm*—Arent Fox LLP

(57) ABSTRACT

The present method generates a greater number of hot holes than those generated by normal write/erase operations, thereby making it possible to evaluate an operation of a non-volatile memory with respect to hot holes. The present method performs a write operation to the non-volatile memory at lower temperatures than normal temperatures at normal use or/and at a lower operation voltage than a normal operation voltage at normal use, so as to generate a greater number of hot holes than those generated by normal write/erase operations between floating gates and drains of the memory, and then evaluates the operation of the memory while exposing it to the normal operation temperatures. This method is applicable to reliability tests of non-volatile memories such as FLASH memories.

15 Claims, 9 Drawing Sheets

U.S. PATENT DOCUMENTS

| | | | |
|---|---|---|---|
| 6,151,693 A * | 11/2000 | Arnold et al. | 714/718 |
| 6,249,457 B1 | 6/2001 | Okamoto | |
| 6,339,557 B1 * | 1/2002 | Kawaguchi et al. | 365/211 |
| 6,349,060 B1 * | 2/2002 | Ogura | 365/185.21 |
| 6,405,277 B1 * | 6/2002 | Jen et al. | 711/4 |
| 6,426,891 B1 * | 7/2002 | Katori | 365/175 |
| 6,646,919 B1 * | 11/2003 | Madurawe et al. | 365/185.21 |
| 6,803,299 B2 * | 10/2004 | Eitan | 438/593 |
| 6,970,007 B2 * | 11/2005 | Miyakita | 324/765 |
| 7,054,705 B2 * | 5/2006 | Ogawa et al. | 700/121 |
| 2002/0018369 A1 * | 2/2002 | Ogura | 365/185.21 |
| 2005/0048708 A1 * | 3/2005 | Yamada et al. | 438/197 |
| 2005/0116338 A1 * | 6/2005 | Hirai | 257/734 |
| 2005/0153465 A1 * | 7/2005 | Wada et al. | 438/14 |
| 2005/0258456 A1 * | 11/2005 | Margolin | 257/213 |

FOREIGN PATENT DOCUMENTS

| | | |
|---|---|---|
| JP | 2865456 | 12/1998 |
| JP | 2000-100180 A | 4/2000 |
| JP | 2000-131398 | 5/2000 |

OTHER PUBLICATIONS

A Novel SONOS Nonvolatile Flash Memory Device Using Hot Hole Injection for Write and Tunneling to/from Gate for Erase Y. Wang, Y. Zhao, B. M. Khan, C. L. Doherty, J. D. Krayer, and M. H. White Sherman Fairchild Center, Department of Electrical and Computer Engineering Lehigh University, Bethlehem, PA 18015, USA.*

* cited by examiner

US 7,392,444 B2

NON-VOLATILE MEMORY EVALUATING METHOD AND NON-VOLATILE MEMORY

BACKGROUND OF THE INVENTION

1. Field of the Invention

The present invention relates to a method for evaluating (reliability testing) non-volatile memories such as FLASH memories. The invention particularly relates to a method for evaluating operation of such a non-volatile memory with respect to hot holes, and also to non-volatile memories with functions required to realize the present evaluation method.

2. Description of the Related Art

FIG. 8 is a block diagram showing a construction of a typical non-volatile memory (for example, a flash memory). The non-volatile memory 100 includes: a cell array 101 composed of a large number of memory cells 110 arranged in a matrix-like form; a word line selector 120, a write controller 130, a sense amplifier 140, a data selector 150, and a controller 160.

Here, each memory cell 110 includes a floating gate 111, a control gate (corresponding to gate terminal G), a source diffusion area (corresponding to source terminal S), and a drain diffusion area (corresponding to drain terminal D), all of these being formed on a semiconductor substrate. Further, between the floating gate 111 and the semiconductor substrate (not illustrated) is formed an oxide film thin enough to allow electrons to move into the floating gate 111 due to the tunnel phenomenon.

The word line selector 120 has an address decoder (not shown in FIG. 8; item 122 of FIG. 6) and is connected via word line 121 to gate terminal G of each memory cell 110 aligned in every row. In response to an address input, the word line selector 120 performs a decoding operation and selects/specifies a word line 121 that is connected to a target memory cell 110 to and from which data is to be written and read. The write controller 130, which is connected via a bit line 131 to drain terminal D of each memory cell 110 aligned in every column, controls data writing to a target memory cell 110. The sense amplifier 140 amplifies data signals read out from the memory cells 110; the data selector 150 selectively outputs the data signals amplified by the sense amplifier 140; the controller 160 controls operation of the write controller 130, the sense amplifier 140, and the data selector 150, in response to control signals received from an external apparatus.

A description will be made hereinbelow of the operation principle of each memory cell 110 of the non-volatile memory 100, referring to FIG. 9 and FIG. 10. FIG. 9 is a view for describing the operation principle of data writing to a memory cell 110; FIG. 10 is a view describing the operation principle of data erasing from a memory cell 110.

As shown in FIG. 9, for example, upon data writing to a memory cell 110, voltages of 10V, 5V, and 0V are applied to gate terminal G, drain terminal D, and source terminal S of the memory cell 110 via word line 121, bit line 131, and a source line, respectively, the floating gate 111 of the memory cell 110 being thereby charged with electrons ($e^-$; hot electrons). In this manner, electrons ($e^-$) stored in the floating gate 111 set the memory cell 110 to an OFF state, whereby data "0", for example, is held therein. In contrast to this, without such electrons ($e^-$) stored in the floating gate 111, the memory cell 110 is set to an ON state, whereby data "1", for example, is held therein.

As shown in FIG. 10, when erasing data stored in the memory cell 110 (when removing electrons stored in the floating gate 111), voltages of 0V and 10V are applied to the gate terminal G and the drain terminal D of the memory cell 110 via the word line 121 and the bit line 131, respectively, the electrons ($e^-$) being thereby removed from the floating gate 111.

When such an evaluation (reliability test) of a non-volatile memory 100, or more precisely, evaluation of its data retention property, is performed, it is necessary to consider that loss of electron charge in the floating gate 111 increases with time. Therefore, when such a non-volatile memory 100 is tested at shipment by manufacturers or at installation by users, the loss (electric charge leak resulting from defects in floating gate films, particles, and so on) is accelerated in some way to evaluate or screen the data retention property in a short time. Generally speaking, the electric charge leak is accelerated with higher atmospheric temperatures. Hence, on the basis of this principle, the acceleration is performed by exposing the non-volatile memory 100 to high temperatures or performing an operation test of the non-volatile memory 100 at high temperatures (for example, Japanese Patent Number 2865456 and Japanese Patent Application Publication Number 2000-13 1398).

In the field of non-volatile memories, the following new fault mode (phenomenon) has been recently discovered. When a non-volatile memory 100 is subjected to write/erase operations with a high voltage applied thereto, holes ($e^+$), so-called hot holes, are trapped in an oxide film under the floating gate 111 as shown in FIG. 11, and such hot holes serve as media that neutralizes the floating gate 111 by removing the electrons stored therein. More precisely, at the time of programming (or data erasing), hot holes ($e^+$) concentrating between the floating gate 111 and the drain capture electric charge ($e^-$) stored in the floating gate 111, whereby the electric charge is removed, so that the logic held in the memory cell 110 is resultantly inversed.

The following are three possible causes of such a phenomenon. Firstly, programming potentials higher than design specifications caused by manufacture variations or any other reasons enhance generation of hot holes ($e^+$). Secondly, a high voltage applied by the word line 121 to the source or the drain enhances neutralization of electric charge ($e^-$) stored in the floating gate 111, which neutralization is caused by hot holes ($e^+$). Thirdly, the floating gate 111 downsized with recent downsizing of the non-volatile memory 100 (memory cell 110) can only store a reduced amount of electric charge ($e^-$), so that the floating gate 111 is even more susceptible to the effects of hot holes ($e^+$).

This newly discovered fault mode necessitates evaluation of operation of a non-volatile memory 100 with respect to hot holes ($e^+$). However, in an attempt to accelerate the phenomenon with heat to evaluate the operation using the foregoing common evaluation method for data retention property, hot holes ($e^+$) are diffused and withdrawn, so it is impossible to evaluate the operation of the non-volatile memory 100 with respect to hot holes. Generally speaking, after exposing a non-volatile memory to a 125° C. atmosphere for 168 hours, hot holes vanish completely, and thus the phenomena due to hot holes cannot be detected at all. Japanese Patent Number 2865456, Japanese Patent Application Publication Number 2000-131398, and Japanese Patent Application Publication Number HEI5-205491 disclose techniques relating to non-volatile memory tests, but none of them disclose anything about a method for evaluating operation of a non-volatile memory with respect to hot holes.

Accordingly, current techniques, if used in the operation evaluation with respect to hot holes, will necessitate real time evaluation. For example, it takes three whole years to evaluate a 3-year-span phenomenon in which an electric charge leaks gradually for three years before gargled data (logic inversion)

is eventually caused. In such a situation, a technique of generating an increased number of hot holes is desired so as to speed up the evaluation of operation of a non-volatile memory with respect to hot holes.

SUMMARY OF THE INVENTION

With the foregoing problems in view, it is an object of the present invention to provide a method for generating a greater number of hot holes than those generated by normal write/erase operations, thereby making it possible to evaluate operation of a non-volatile memory with respect to hot holes in a short time.

In order to accomplish the above object, according to the present invention, there is provided a method for evaluating a non-volatile memory, comprising the steps of: writing to the non-volatile memory at a lower temperature than a normal operation temperature so as to generate a greater number of hot holes are generated than by normal write/erase operation between a floating gate and a drain; and evaluating an operation of the non-volatile memory with respect to the hot holes while exposing the non-volatile memory to the normal operation temperature. At this time, the writing step at the lower temperature is preferably performed at least once, after the normal write/erase operation is repeated a predetermined number of times at the normal operation temperature, so that a greater number of hot holes than those to be generated by the normal write/erase operation are generated.

As generic feature, there is provided a method for evaluating a non-volatile memory, comprising the steps of: writing to the non-volatile memory while applying an intermediate potential, which is in the vicinity of a threshold smaller than a normal gate voltage to be applied at normal operation, as a gate voltage so as to generate a greater number of hot holes than those to be generated by normal write/erase operation between a floating gate and a drain; and evaluating an operation of the non-volatile memory with respect to the hot holes while exposing the non-volatile memory to a normal operation temperature. At this time, the writing step to the non-volatile memory with the intermediate potential being applied thereto as a gate voltage is preferably performed at least once, after the normal write/erase operation to the non-volatile memory is repeated a predetermined number of times with the normal gate voltage being applied thereto, so that a greater number of hot holes than those to be generated by the normal write/erase operation are generated.

As another generic feature, there is provided a method for evaluating a non-volatile memory, comprising the steps of: writing to the non-volatile memory at a lower temperature than a normal operation temperature while applying an intermediate potential, which is in the vicinity of a threshold smaller than a normal gate voltage to be applied at normal operation, as a gate voltage so as to generate a greater number of hot holes than those to be generated by normal write/erase operation between a floating gate and a drain; and evaluating an operation of the non-volatile memory with respect to the hot holes while exposing the non-volatile memory to a normal operation temperature. At that time, the writing step to the non-volatile memory at the lower temperature, with the intermediate potential being applied thereto as a gate voltage, is preferably performed at least once, after the normal write/erase operation to the non-volatile memory is repeated a predetermined number of times at the normal operation temperature, with the normal gate voltage being applied thereto, so that a greater number of hot holes than those to be generated by the normal write/erase operation are generated.

As a preferred feature, the non-volatile memory is placed in a low-temperature vessel to realize the lower temperature than the normal operation temperature. As another preferred feature, a gate voltage switching means, which is previously provided on the non-volatile memory for selectively applying one of the normal gate voltage and the intermediate potential as a gate voltage, is used to apply the intermediate potential as a gate voltage, upon evaluation of the operation of the non-volatile memory with respect to the hot holes.

As a further generic feature, there is provided a non-volatile memory, comprising: a first power supply for applying a normal gate voltage at normal operation; a second power supply for applying an intermediate potential, which is in the vicinity of a threshold smaller than the normal gate voltage to be applied at the normal operation, as a gate voltage, the second power supply being used, upon evaluation of operation of the non-volatile memory, to generate a greater number of hot holes than those to be generated by normal write/erase operation between a floating gate and a drain; and gate voltage switching means for selectively applying one of the normal gate voltage, which is generated by the first power supply, and the intermediate potential, which is generated by the second power supply, as a gate voltage.

According to the foregoing non-volatile memory evaluating method, data writing is performed to the non-volatile memory at temperatures lower than normal operation temperatures, thereby increasing the number of hot holes generated between floating gates and drains of the non-volatile memory, so that hot holes greater in number than those generated by normal write/erase operations are generated. Since such a non-volatile memory is exposed to normal operation temperatures to accelerate phenomena (garbled data or the like due to leaking electric charge) caused by hot holes, operation evaluation (reliability testing) of the non-volatile memory can be performed in a very short time. At that time, after write/erase operations are repeated a predetermined number of times at normal temperatures to wear out the non-volatile memory to some degree, data writing is performed only once to the worn-out non-volatile memory at lower temperatures than normal temperatures, whereby a great number of hot holes are generated with high efficiency.

Further, according to the foregoing non-volatile memory evaluating method, a write operation is performed to the non-volatile memory with application of an intermediate potential, which is in the vicinity of a threshold lower than a normal gate voltage, as a gate voltage, thereby increasing the number of hot holes generated between floating gates and drains, so that a greater number of hot holes than those generated by normal write/erase operations are generated. The operation of the non-volatile memory in such a condition is then evaluated while exposing the memory to normal temperatures. Since development of phenomena (garbled data or the like due to a leaking electric charge) caused by hot holes is accelerated with this technique, it is possible to evaluate the operation of the non-volatile memory with respect to hot holes in a very short time. At that time, as has been described above, write/erase operations to the non-volatile memory are repeated a predetermined number of times at normal operation temperatures with a normal gate voltage being applied thereto so as to wear out the non-volatile memory to some degree. Data writing is then performed only once to the worn-out non-volatile memory with application of the aforementioned intermediate potential as a gate voltage, so that it is possible to generate a great number of hot holes with high efficiency.

Furthermore, the non-volatile memory is previously equipped with a gate voltage switching means which selectively applies a normal gate voltage or an intermediate potential, which is in the vicinity of a threshold lower than the normal voltage, as a gate voltage. When evaluating operation of the non-volatile memory with respect to hot holes, the voltage switching means is used to switch the gate voltage in such a manner that the aforementioned intermediate potential is applied as a gate voltage. This simple arrangement will increase the number of hot holes generated between the floating gates and the drains by avalanche effect, so that hot holes greater in number than those generated by normal write/erase operations are generated. Since development of phenomena (garbled data or the like due to leaking electric charge) caused by hot holes can be accelerated with this technique, it is possible to evaluate an operation of the non-volatile memory with respect to hot holes in a very short time.

Other objects and further features of the present invention will be apparent from the following detailed description when read in conjunction with the accompanying drawings.

DESCRIPTION OF THE PREFERRED
EMBODIMENT(S)

Embodiments of the present invention will now be described with reference to the accompanying drawings.

[1] First Embodiment

First Method

Electrons and hot holes are more likely to surmount an energy barrier and move at lower temperatures because of the fact that electrons and hot holes acquire higher levels of energy at lower temperatures. Accordingly, write/erase operations performed to a non-volatile memory at low temperatures (for example, −40° C. to −20° C.) will enhance generation of hot holes. A method (first method) for evaluating a non-volatile memory according to the first embodiment of the present invention is developed with an eye on this characteristic feature, in which method, data writing is performed to a non-volatile memory at low temperatures in order to artificially generate a greater number of hot holes than those generated by write/erase operation at normal temperatures with accelerate speed. With this method, it is possible to shorten the time required for real time testing of the non-volatile memory, which is performed afterward during a non-high temperature exposure test of the memory, without the necessity of accelerating hot hole generation at high temperatures.

Figure 1:
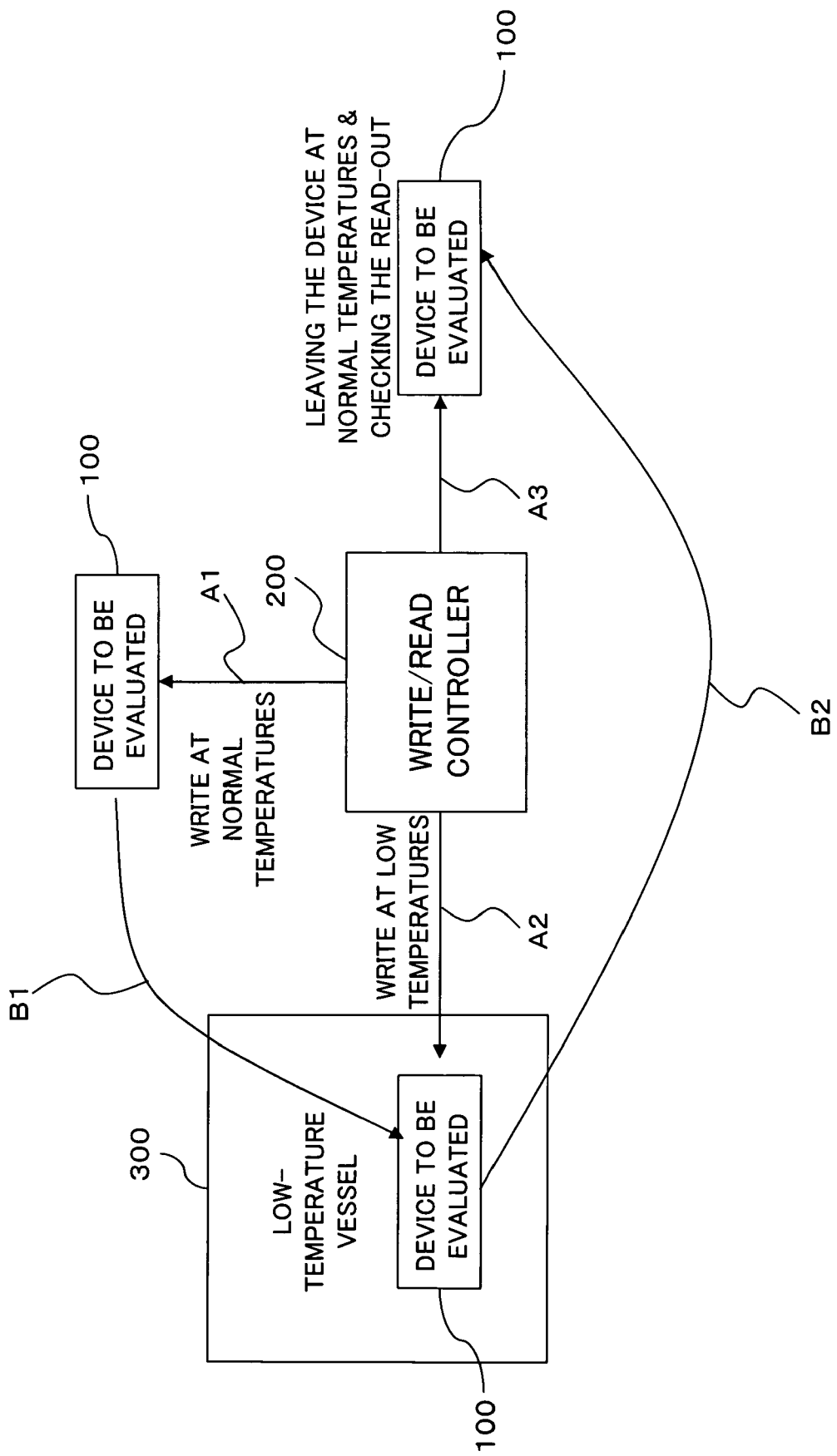
FIG. 1 is a view for a brief description of a process of evaluating a non-volatile memory according to a first embodiment of the present invention.
Figure 2:
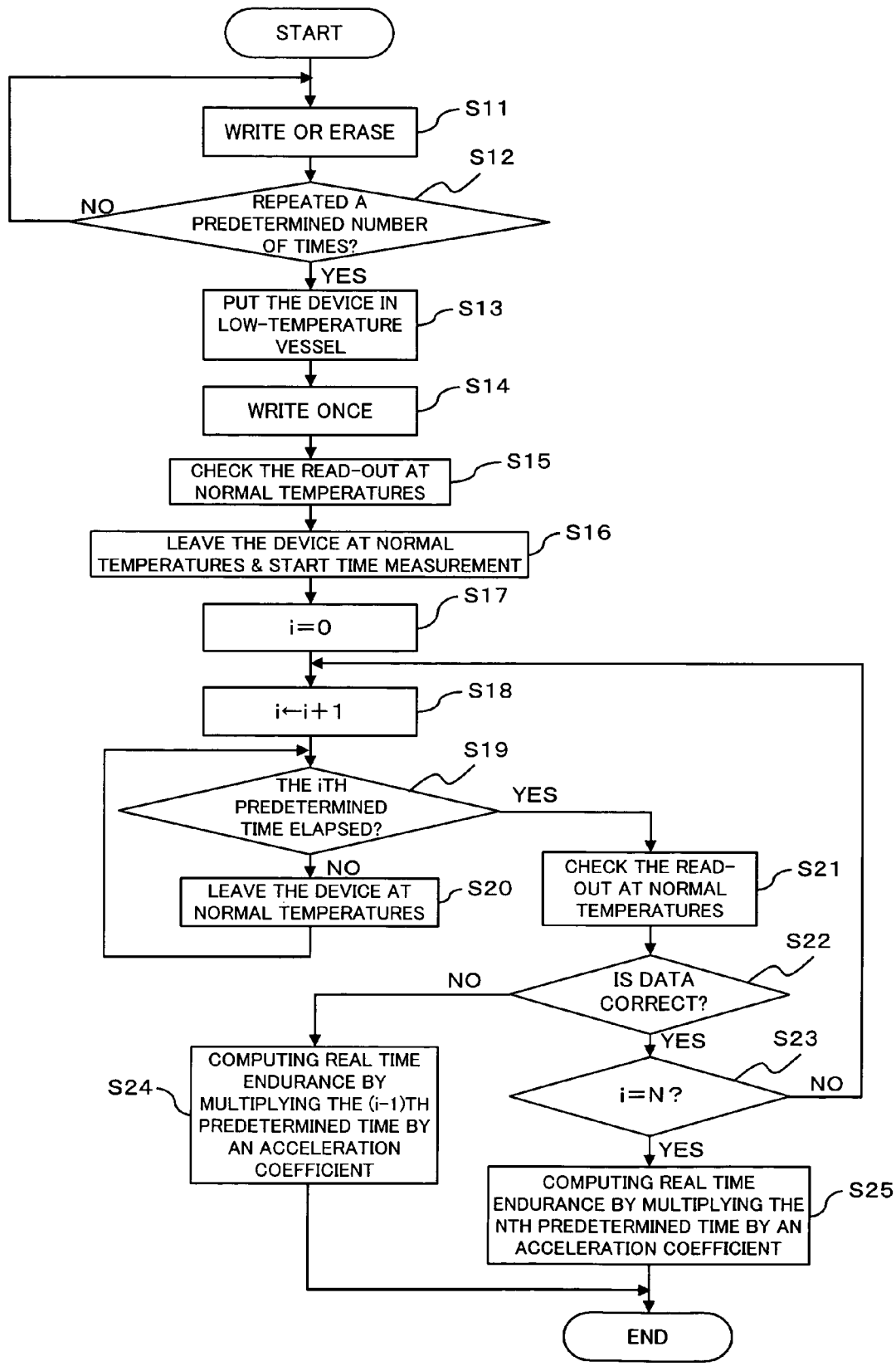
FIG. 2 is a flowchart showing the evaluation process of a non-volatile memory according to the first embodiment.

Referring to FIG. 1 and FIG. 2, a description will be made hereinbelow of a method (first method) for evaluating a non-volatile memory according to the first embodiment.

In the beginning, with reference to FIG. 1, a brief description will be given of procedures (first method) of the non-volatile memory evaluation of the first embodiment.

In the first method, write/erase operations to a non-volatile memory (a target device to be evaluated) 100 are repeated a predetermined number of times (for example, 500,000 times) by a write/read controller 200 at normal operation temperatures (normal temperatures) at normal use (see arrow A1), and the non-volatile memory 100 is then placed in a low-temperature vessel 300 (see arrow B1). While the non-volatile memory 100 is being placed in the low-temperature vessel 300, or while the non-volatile memory 100 is kept at lower temperatures (for example, −40° C. to −20° C.) than the normal operation temperatures, the write/read controller 200 performs a write operation to the non-volatile memory 100 at least once (see arrow A2). As a result, hot holes greater in number than those generated by normal write/erase operations at normal operation temperatures are generated between floating gates (item 111 of FIG. 8 through FIG. 11) and drains of the non-volatile memory 100.

After generating such numerous hot holes in an artificial manner, the non-volatile memory 100 is pulled out of the low-temperature vessel 300, and the write/read controller 200 then performs read-out checking of the non-volatile memory 100 (see arrow A3) at regular time intervals while exposing the non-volatile memory 100 to the normal operation temperatures (normal temperatures) (see arrow B2) to evaluate an operation of the non-volatile memory 100 with respect to hot holes.

Referring to the flow chart (step S11 through step S25) of FIG. 2, the method (first method) for evaluating a non-volatile memory according to the first embodiment will be more given in more detail hereinbelow.

Write/erase operations to the non-volatile memory 100 are repeated a predetermined number of times at normal temperatures (for example, 500,000 times) (steps S11 and S12), and the non-volatile memory 100 is then placed in the low-temperature vessel 300 (step S13). While keeping the non-volatile memory 100 in the low-temperature vessel 300, or while keeping the non-volatile memory 100 at lower temperatures (for example, −40° C. to −20° C.) than the normal temperatures, a write operation is performed at least once to the non-volatile memory 100 (step S14).

After that, the non-volatile memory 100 is pulled out of the low-temperature vessel 300, and read-out checking of the non-volatile memory 100 is performed at normal temperatures (step S15). If it is evaluated that the read-out data is not correct, it is decided that the non-volatile memory 100 has some failure, and the process ends without performing subsequent evaluation procedures, or the write operation at step S14 is repeated once again. On the other hand, if it is evaluated at step S15 that the read-out data is correct, the non-volatile memory 100 starts to be exposed to the normal temperatures, and the time elapsed after the start of the exposure is also begun to be measured (step S16).

Then, after initiation of the exposure to normal temperatures and of the time measurement, read-out checking is performed at respective time points, from the 1st to the Nth (N is a natural number equal to 2 or greater) time point. The 1st to the Nth time points are, for example, 50 hours, 100 hours, 150 hours, 200 hours, . . . , so that read-out checking of the non-volatile memory 100 is performed every 50 hours.

Concretely, after the start of the normal temperature exposure and the time measurement, initial setting of i=0 is performed (step S17), and it is evaluated whether or not the exposure time, during which the non-volatile memory 100 is exposed to normal temperatures, has reached the ith predetermined time (i=1, 2, . . . , N) (steps S18 and S19). If the evaluation result is negative (NO route of step S19), the non-volatile memory 100 continues to stand at the normal temperatures (step S20), whereas if the evaluation result turns positive (YES route of step S19), read-out checking is performed on the non-volatile memory 100 at the normal temperatures (step S21).

Upon this read-out checking, if the read-out data at the ith predetermined time is detected to be correct (YES route of step S22), it is evaluated whether or not i=N (step S23). If the evaluation result is negative (NO route of step S23), the procedure returns to step S18, and i is replaced with i+1, and then waits for the exposure time to reach the next predetermined time (step S19 and step S20).

On the other hand, if it is decided that the read-out data at the ith predetermined time is not correct (NO route of step S22), the real time data-holding ability is computed by multiplying the immediately preceding (i−1)th predetermined time, at which the read-out data was correct, by an acceleration coefficient previously obtained, and the thus-computed time duration is regarded as the endurance time (evaluation result of the non-volatile memory 100 with respect to hot holes) of the non-volatile memory 100 at normal use (step S24).

Further, if it is decided that i=N at step S23 (YES route of step S23), which indicates that the read-out data has continuously been correct until the exposure time reaches the maximum (the Nth predetermined time) of the predetermined time, the real time data-holding ability is computed by multiplying the Nth predetermined time by the foregoing acceleration coefficient, and the thus-computed time duration is regarded as the aforementioned endurance time (evaluation result of the non-volatile memory 100 with respect to hot holes) of the non-volatile memory 100 (step S25).

In this manner, according to the non-volatile memory evaluating method (first method) of the first embodiment, data writing is performed to the non-volatile memory 100 at temperatures lower than normal operation temperatures, thereby artificially increasing the number of hot holes generated between floating gates and drains of the non-volatile memory 100, so that hot holes greater in number than those generated by normal write/erase operations are generated. Since such a non-volatile memory 100 is exposed to normal operation temperatures, thereby accelerating phenomena (garbled data or the like due to a leaking electric charge) caused by hot holes, operation evaluation (reliability test) of the non-volatile memory 100 can be performed in a very short time.

At that time, as is described above in the first embodiment, write/erase operations are repeated at normal temperatures a predetermined number of times (for example, 500,000 times) to wear out the non-volatile memory 100 to some degree, and data writing is then performed only once to the worn-out non-volatile memory 100 at lower temperatures than normal temperatures, whereby a great number of hot holes are generated efficiently.

[2] Second Embodiment

Second Method

Figure 4:
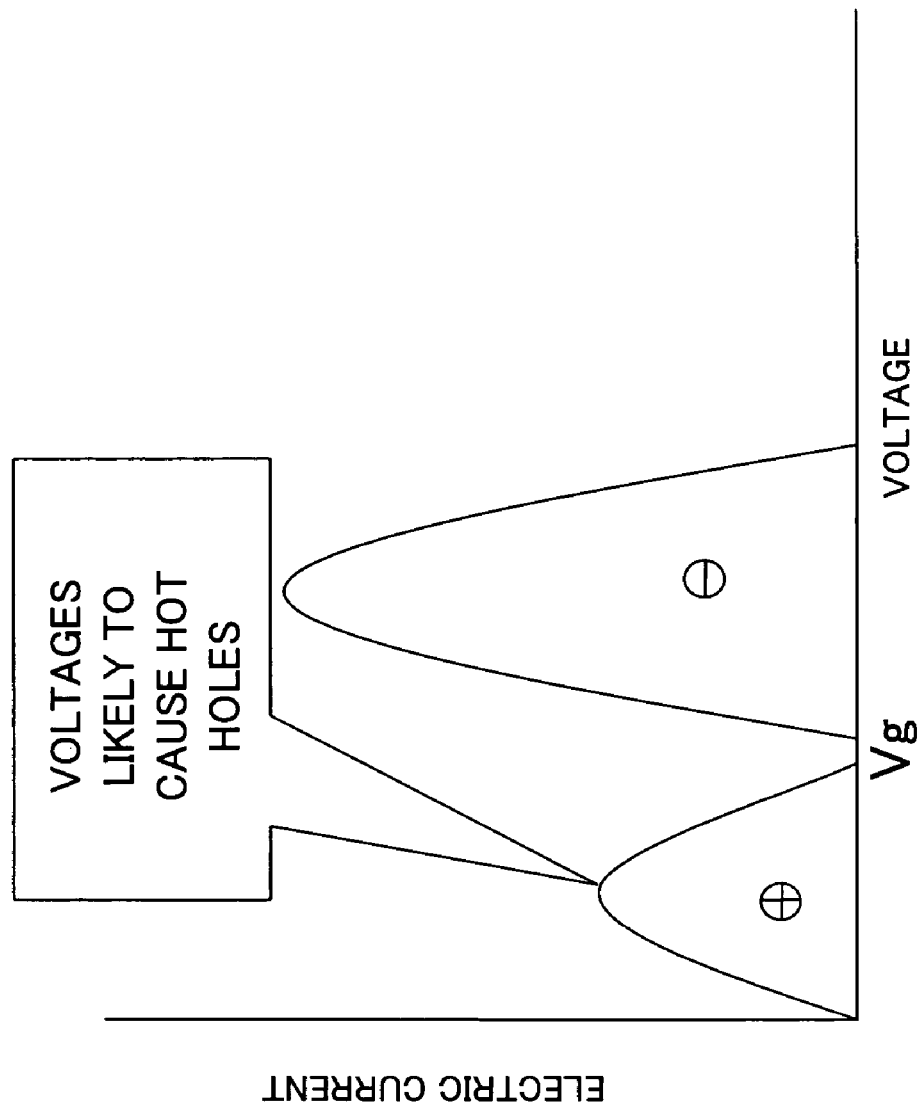
FIG. 4 is a graph indicating gate voltages (gate voltages at normal use and intermediate potentials) applied in the second embodiment.

A method (second method) for evaluating a non-volatile memory of a second embodiment of the present invention utilizes the following avalanche effect. As shown in FIG. 4, if the gate voltage (potential) Vg applied to the memory cells (item 110 of FIG. 5, and FIG. 8 through FIG. 11) is as low as an intermediate potential which is in the vicinity of the threshold, the number of hot holes tends to increase. Thus, the method (second method) for evaluating a non-volatile memory according to the second embodiment controls the gate voltage Vg in the non-volatile memory to be the aforementioned intermediate potential, not a normal operation voltage, and data writing is performed to the non-volatile memory at such a low voltage, thereby artificially generating a greater number of hot holes than those generated by normal write/erase operations with accelerated speed. As a result, the time required for real time testing, which is performed during a non-high temperature exposure test performed afterward, can be shortened, without the necessity of accelerating hot hole generation at high temperatures. Note that FIG. 4 indicates the gate voltage Vg (gate voltages and intermediate potentials at normal use) applied in the second embodiment.

Now the avalanche effect will be explained hereinbelow. In each memory cell, if a potential higher than a gate voltage is applied to the drain, pairs of electrons ($e^-$) and hot holes ($e^+$) are generated in the electric field of the depletion layer of a PN junction. The isolated electrons collide with other Si atoms, thereby generating pairs of electrons and hot holes in an avalanche-like manner. This phenomenon is called the avalanche effect. Once an avalanche range is achieved, operation resistance is minimized to an extremely small value, thereby causing a steep increase in electric current. With a high gate voltage, electrons behave dominantly, whereas with a low gate voltage, hot holes do the same. In addition, since electron leak is enhanced at high temperatures, thereby causing hot holes to be neutralized, hot holes are more likely to be generated at low temperatures.

Next, referring to the flow chart (step S31 through step S45) of FIG. 3, the method (second method) for evaluating a non-volatile memory according to the second embodiment will be given in more detail hereinbelow. It is to be noted that in the second embodiment, as will be described later with reference to FIG. 5 and FIG. 6, a device to be evaluated is a non-volatile memory 100A with a function of selectively switching the gate voltage between a normal potential at normal use and the above-mentioned intermediate potential.

Figure 3:
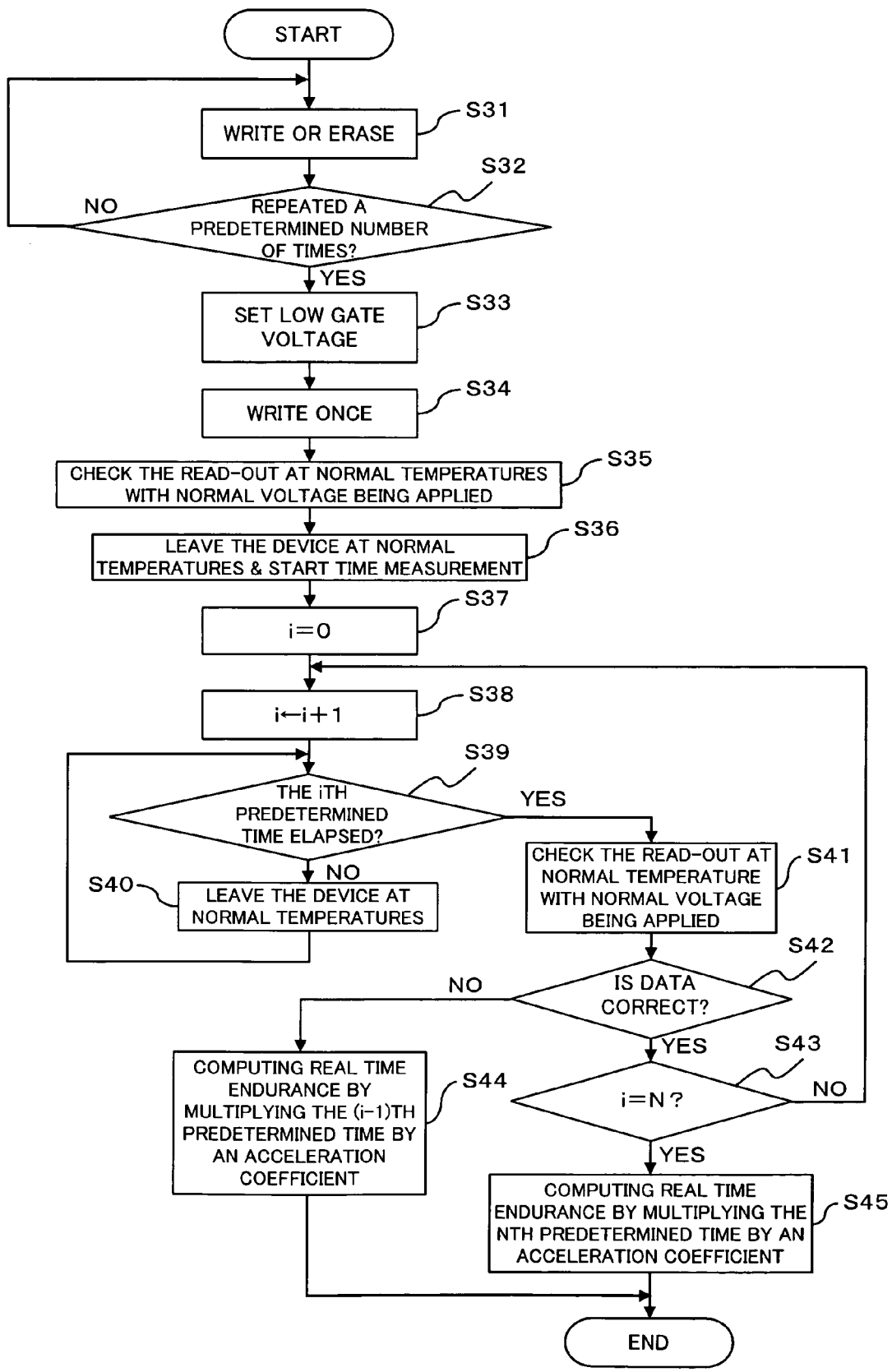
FIG. 3 is a flowchart showing an evaluation process of a non-volatile memory according to a second embodiment of the present invention.

As shown in FIG. 3, in the second embodiment, also, write/erase operations to the non-volatile memory 100A are repeated a predetermined number of times (for example, 500, 000 times) at normal temperatures with a normal voltage being applied thereto (at normal operation temperatures at normal use with a normal gate voltage at normal use) (step S31 and step S32), and the gate voltage of the non-volatile memory 100A is set to a low voltage (the aforementioned intermediate potential) (step S33). Under a condition where such a low gate voltage is selected, data writing is performed only once to the non-volatile memory 100A (step S34). As a result, due to the avalanche effect, a greater number of hot holes than those generated by normal write/erase operations are generated between floating gates and drains of the non-volatile memory 100A.

In this manner, after generating a large number of hot holes in an artificial manner, the gate voltage of the non-volatile memory 100A is switched from a low voltage to a normal gate voltage at normal use, and read-out checking of the non-volatile memory 100A is performed at a normal temperature with application of a normal voltage thereto (step S35). Hereinafter, the procedures of step S35 through step S45 of the second embodiment correspond to the procedures of step S15 through step S25 of the first embodiment, so their detailed description will be omitted here.

As in the case of the first embodiment, read-out checking of the non-volatile memory 100A is performed, by undergoing steps S36 through S43 of the second embodiment, at regular time intervals while exposing the non-volatile memory 100A to normal operation temperatures (normal temperatures), to evaluate operation of the non-volatile memory 100A with respect to hot holes. Eventually, at step S44 or step S45, real time data-holding ability is computed by multiplying the immediately preceding (i−1)th predetermined time, at which the read-out data was correct, or the Nth predetermined time, by an acceleration coefficient previously obtained, and the thus-computed time duration is regarded as the endurance time (evaluation result of the non-volatile memory 100A with respect to hot holes) of the non-volatile memory 100A at normal use.

Figure 5:
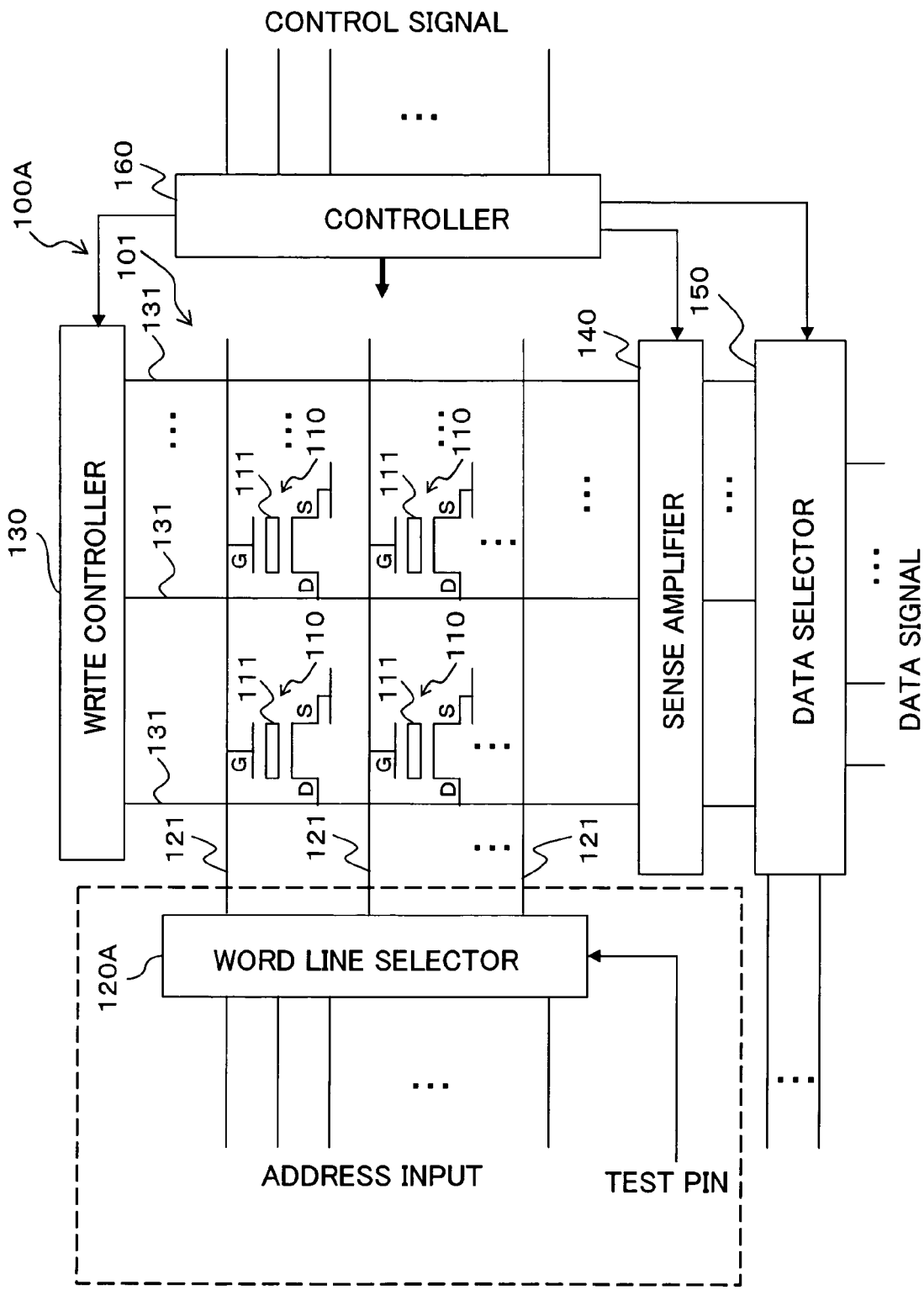
FIG. 5 is a view illustrating a construction of a non-volatile memory used in the second embodiment.
Figure 6:
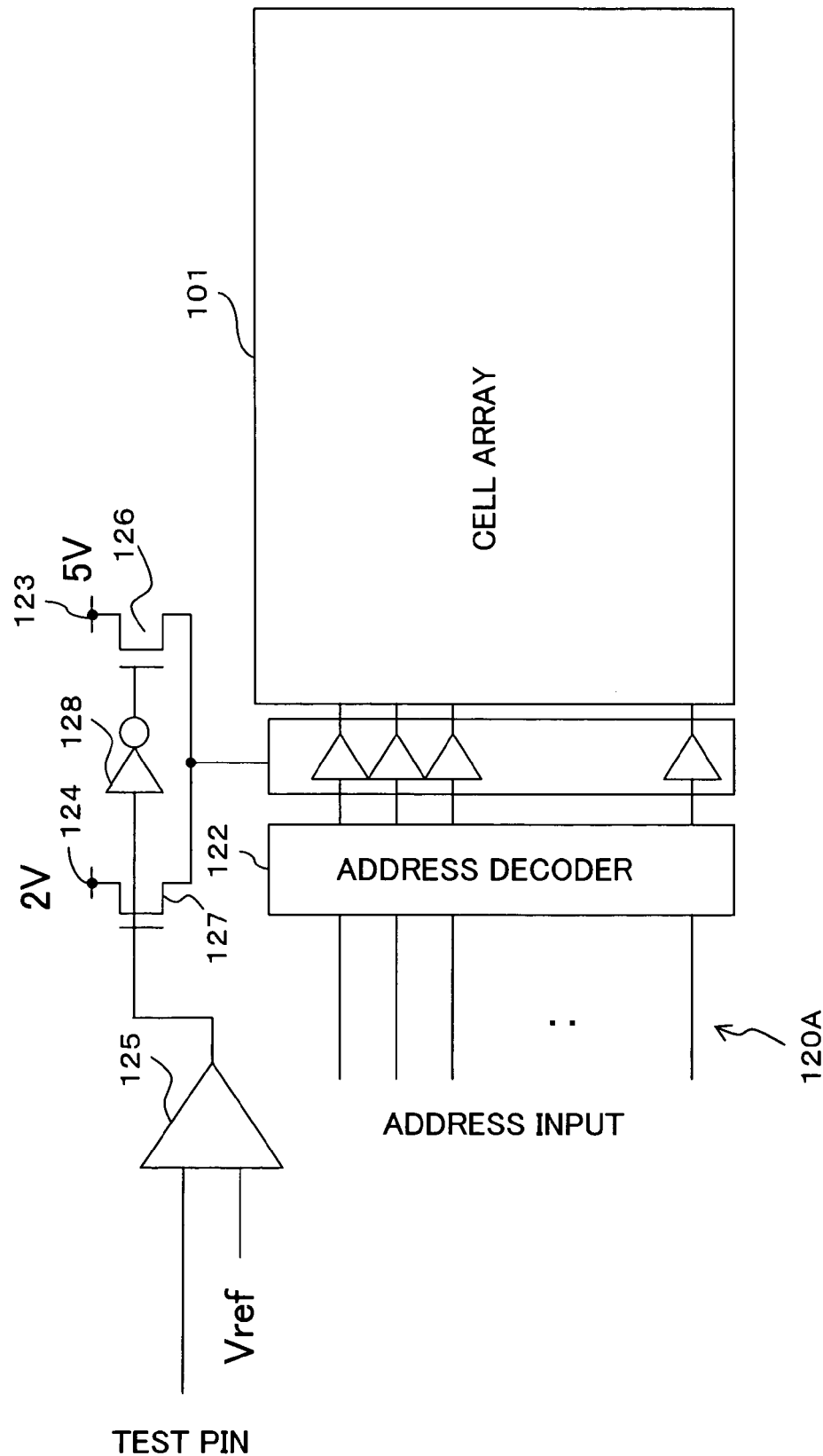
FIG. 6 is a view illustrating an essential part (word line selector) of the non-volatile memory of FIG. 5.
Figure 8:
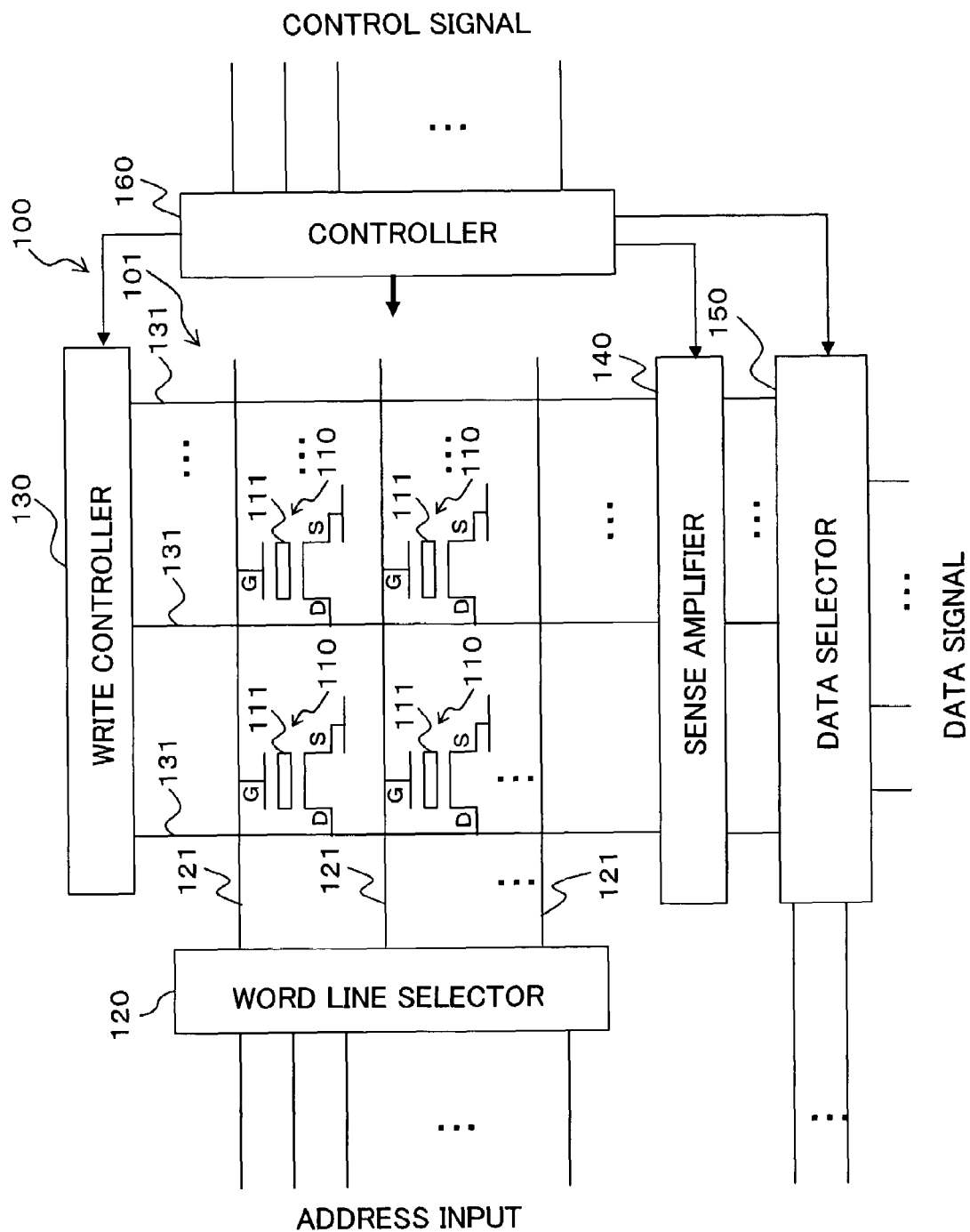
FIG. 8 is a block diagram showing a construction of a typical non-volatile memory.
Figure 10:
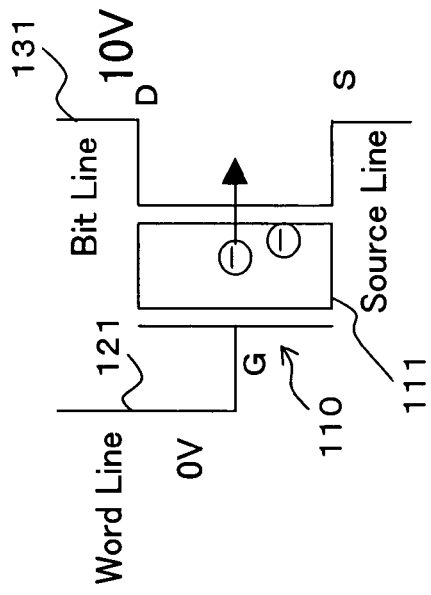
FIG. 10 is a view for describing the operation principles of data erasing from memory cells.
Figure 9:
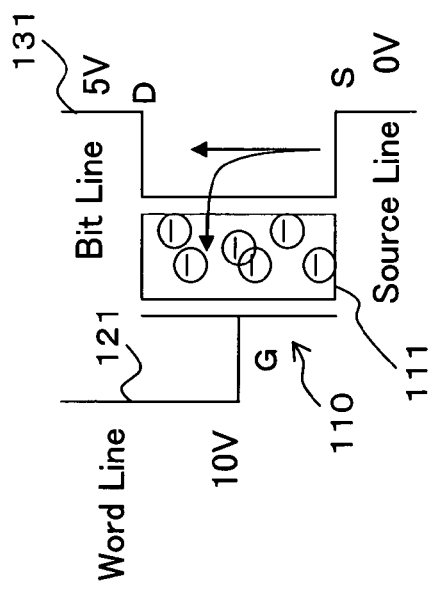
FIG. 9 is a view for describing the operation principles of data writing to memory cells.
Figure 11:
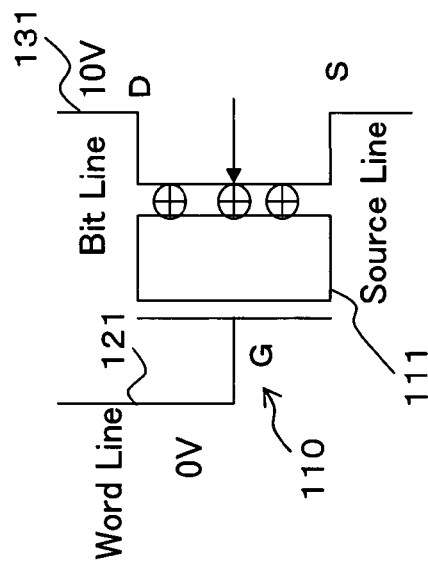
FIG. 11 is a view for describing the principles of generation of hot holes in memory cells.

Next, referring to FIG. 5 and FIG. 6, a description will be made hereinbelow of a construction of the non-volatile memory 100A with a voltage switching function for use in the second embodiment. Here, FIG. 5 is a schematic of a construction of the non-volatile memory 100A, and FIG. 6 is a schematic of an essential part (word line selector 120A) of the non-volatile memory 100A. In FIG. 5, FIG. 6, and FIG. 8, like reference numbers and characters to those that have already been described designate similar parts or elements, so their detailed description is omitted here.

For the purpose of effectively realizing the aforementioned avalanche effect, the non-volatile memory 100A (a target device to be evaluated) of FIG. 5 and FIG. 6 is constructed in such a way that switching of the word line voltage (or gate voltage) can be performed in the device. Concretely, the non-volatile memory 100A has two types of power supply systems, 123 and 124, for supplying two kinds of gate voltages respectively, and also a function (a gate voltage switching means; will be detailed later) of switching between a normal operation and a special condition (at the time of device evaluation).

The non-volatile memory 100A of FIG. 5 according to the second embodiment is similar in construction to the non-volatile memory 100 of FIG. 8 in that the non-volatile memory 100A includes: a cell array 101 formed by a large number of memory cells 110 arranged in a matrix-like form; a word line selector 120A; a write controller 130; a sense amplifier 140, a data selector 150, and a controller 160. However, the non-volatile memory 100A of the second embodiment has a word line selector 120A with a gate voltage switching means (will be described later) in place of the word line selector 120 of FIG. 5.

The word line selector 120A, as shown in FIG. 6, includes an address decoder 122, which is connected to gate terminals G of the memory cells 110 in every row via word line 121. In response to an address input, the address decoder 122 performs a decoding operation and selects/specifies a word line 121 that is connected to a target memory cell 110 to and from which data is to be written and read.

The word line selector 120A is connected to a test pin (not illustrated) provided for the non-volatile memory 100A, from which pin a switch signal is output to the gate voltage switching means (described later).

The non-volatile memory 100A, as shown in FIG. 6, has two types of power supply systems: first power supply 123 and second power supply 124. The first power supply 123 applies a normal gate voltage (for example, 5V) at normal use, as a gate voltage Vg, to each memory cell 110; the second power supply 124, which is used at operation evaluation to cause an avalanche effect to generate a greater number of hot holes than those generated by normal write/erase operations between floating gates and drains, applies an intermediate potential (for example 2V), which is in the vicinity of a threshold lower than the foregoing normal gate voltage, as a gate voltage Vg, to the gate of each memory cell 110.

The word line selector 120A has a gate voltage switching means including a comparator 125, FETs (Field Effect Transistors), 126 and 127, and an inverter 128, as shown in FIG. 6, which switching means switches between a normal gate voltage and an intermediate potential to apply the selected gate voltage Vg to the gate of each memory cell 110. When evaluating an operation of the non-volatile memory 100A with respect to hot holes, the voltage switching means is used to apply the aforementioned intermediate potential, as a gate voltage Vg, to the gate of each memory cell 110.

Here, the comparator 125 compares a switch signal output from the test pin and a predetermined reference voltage Vref. If the switch signal exceeds the reference voltage Vref, the comparator 125 switches the output signal from a Low state to a High state.

The FETs, 126 and 127, connect the power supply systems, 123 and 124, respectively, to the word line 121. If a High-state signal is input to the gates of the FETs, 126 and 127, the power supply systems, 123 and 124, are connected to the word line 121, and a normal gate voltage at normal use or the aforementioned intermediate potential is applied to the gate of each memory cell 110 as a gate voltage Vg.

An output signal of the comparator 125 is directly input to the gate of the FET 127, while it is also input to the gate of the FET 126 via the inverter 128. With this arrangement, if an OFF-state (Low-state) switch signal is output from the test pin, the comparator 125 outputs a Low-state signal, which is then input to the gate of the FET 127, while the gate of the FET 126 receives a High-state signal via the inverter 128, so that a normal gate voltage at normal use, which is supplied by the first power supply system 123, is applied to the gate of each memory cell 110 as a gate voltage Vg. On the other hand, if an ON-state (High-state) switch signal is output from the test pin, the comparator 125 outputs a High-state signal, which is then input to the gate of the FET 127, while the gate of the FET 126 receives a Low-state signal via the inverter 128, so that an intermediate voltage supplied by the second power supply system 124 is applied to the gate of each memory cell 110 as a gate voltage Vg.

When evaluating the operation of the non-volatile memory 100A of the present embodiment with respect to hot holes, an ON-state (High-state) switch signal is input from the test pin, and the gate voltage switching means is used to selectively apply the above intermediate potential as a gate voltage.

These simple procedures increase the number of hot holes generated between the floating gates and the drains by the avalanche effect, so that greater numbers of hot holes are generated than by normal write/erase operations.

In this example, the gate voltage switching means has a comparator 125, FETs, 126 and 127, and an inverter 128, and a switching operation is performed in response to a switch signal output from the test pin provided for the non-volatile memory 100A. However, the construction of the gate voltage switching means should by no means be limited to this, and its switching function can be realized also by applying a high voltage to address lines or by using a mode resistor contained in the non-volatile memory, which makes software-switching available.

According to the method (second method) for evaluating a nonvolatile memory and the non-volatile memory 100A of the present embodiment, a write operation is performed to the non-volatile memory 100A with application of an intermediate potential, which is in the vicinity of a threshold lower than a normal gate voltage, as a gate voltage Vg, thereby increasing the number of hot holes generated between floating gates and drains due to the avalanche effect, so that a greater number of hot holes are generated than by normal write/erase operations. The operation of the non-volatile memory 100A in such a condition is evaluated while the non-volatile memory 100A is being exposed to normal operation temperatures. Since development of phenomena (garbled data or the like due to a leaking electric charge) caused by hot holes is accelerated with this technique, it is possible to evaluate operation of the non-volatile memory 100A with respect to hot holes in a very short time.

At that time, as has been described above, a write/erase operation to the non-volatile memory 100A is repeated a predetermined number of times (for example, 500,000 times) at normal temperatures with a normal gate voltage being applied thereto so as to wear out the non-volatile memory 100A to some degree. Data writing is then performed only once to the worn-out non-volatile memory 100A with application of the aforementioned intermediate potential as a gate voltage, thereby generating a great number of hot holes in an efficient manner.

[3] Third Embodiment

A method for evaluating a non-volatile memory according to a third embodiment of the present invention is a combination of the first method described in the first embodiment and the second method described in the second embodiment.

The procedures of evaluating a non-volatile memory according to a third embodiment of the present invention will be detailed hereinbelow, referring to the flowchart (steps S51 through S65) of FIG. 7. As in the case of the second embodiment, a non-volatile memory 100A having already been described with reference to FIG. 5 and FIG. 6 is used as a device to be evaluated in the third embodiment.

Figure 7:
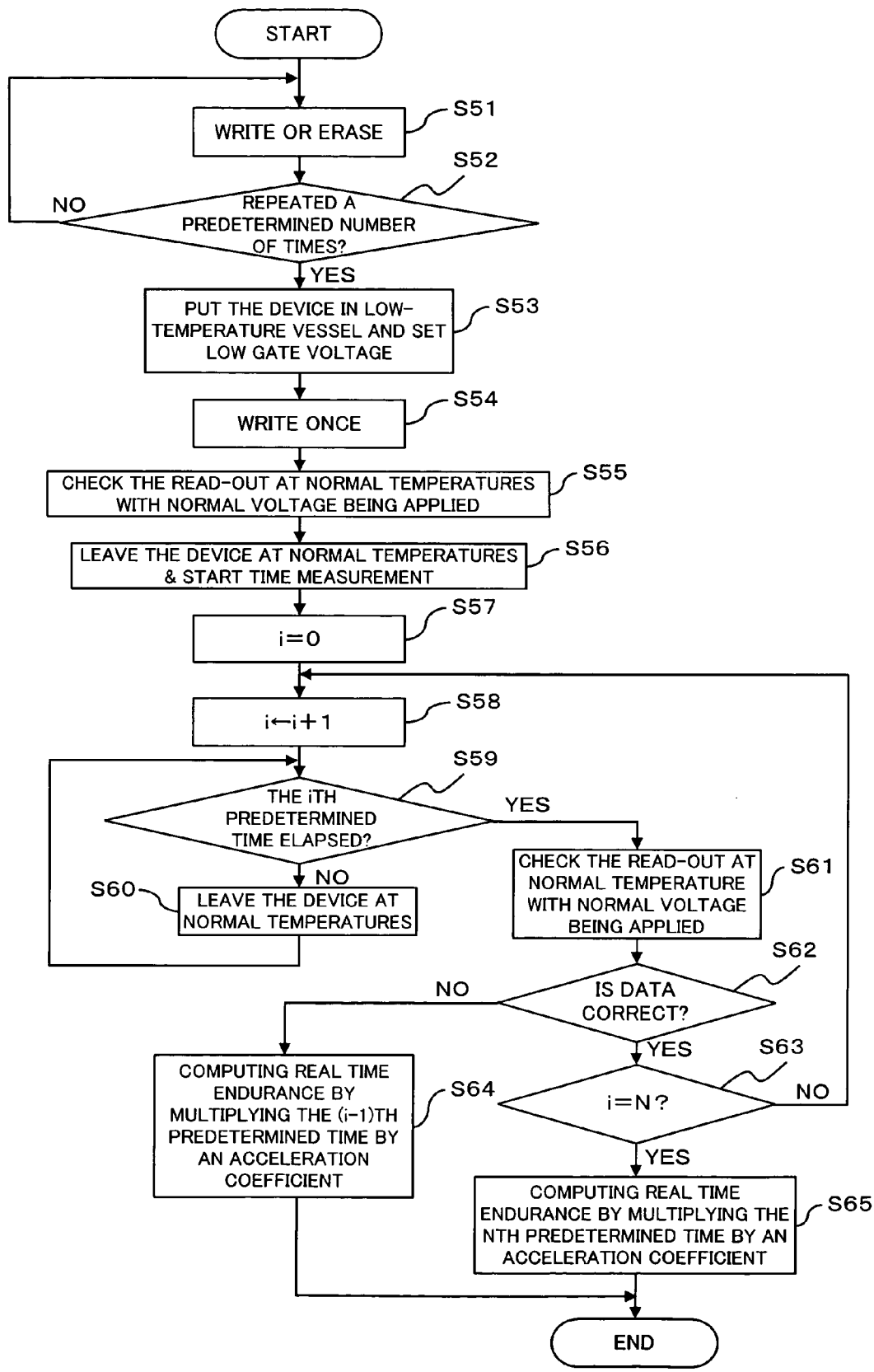
FIG. 7 is a flowchart showing an evaluation process of a non-volatile memory according to a third embodiment of the present invention.

As shown in FIG. 7, in the third embodiment, also, write/erase operations to the non-volatile memory 100A are repeated a predetermined number of times (for example, 500,000 times) at normal temperatures with a normal voltage being applied thereto (at normal operation temperatures at normal use with a normal gate voltage at normal use) (steps S51 and S52), and the non-volatile memory 100A is then placed in the low-temperature vessel 300 (see FIG. 1), and the gate voltage of the non-volatile memory 100A is switched/set to a low voltage (the aforementioned intermediate potential) (step S53). While keeping the non-volatile memory 100A in the low-temperature vessel 300, or while keeping the non-volatile memory 100A at lower temperatures (for example, −40° C. to −20° C.) than normal temperatures, and also with a low voltage being selected as the gate voltage, data writing is performed only once to the non-volatile memory 100A (step S54). As a result, due to such low temperatures and the avalanche effect, a greater number of hot holes than those generated by normal write/erase operations are generated between the floating gates and the drains of the non-volatile memory 100A.

After generating a great number of hot holes in such an artificial manner, the non-volatile memory 100A is pulled out of the low-temperature vessel 300, and the gate voltage of the non-volatile memory 100A is switched from a low voltage into a normal gate voltage at normal use, and read-out checking of the non-volatile memory 100A is performed at normal temperatures with a normal voltage being applied thereto (step S55). Hereinafter, the procedures of step S55 through step S65 of the third embodiment correspond to the procedures of step S15 through step S25 of the first embodiment, so their detailed description will be omitted here.

As in the case of the first and the second embodiments, read-out checking of the non-volatile memory 100A is performed, by undergoing steps S56 through S63, at regular time intervals while exposing the non-volatile memory 100A to normal temperatures, to evaluate an operation of the non-volatile memory 100A with respect to hot holes. Eventually, at step S64 or step S65, real time data-holding ability is computed by multiplying the immediately preceding (i−1)th predetermined time, at which read-out data was correct, or the Nth predetermined time, by an acceleration coefficient previously obtained, and the thus-computed time duration is regarded as the endurance time (evaluation result of the non-volatile memory 100A with respect to hot holes) of the non-volatile memory 100A at normal use.

In this manner, according to the non-volatile memory evaluating method of the third embodiment, a write operation is performed to the non-volatile memory 100A at lower temperatures than normal operation temperatures, while an intermediate potential, which is in the vicinity of a threshold lower than a normal gate voltage, is being applied as a gate voltage Vg to the gate of each memory cell 110. This procedure increases the number of hot holes generated between floating gates and drains more efficiently than in the first and second embodiments, and hot holes greater in number than those generated by normal write/erase operations are generated. Since such a non-volatile memory 100A is exposed to normal operation temperatures, thereby accelerating phenomena (garbled data or the like due to a leaking electric charge) caused by hot holes, the operation evaluation (reliability test) of the non-volatile memory 100A can be performed in a very short time.

Here, as already described above, in the third embodiment, write/erase operations to the non-volatile memory 100A are repeated a predetermined number of times (for example, 500,000 times) at normal operation temperatures with a normal gate voltage being applied thereto so as to wear out the non-volatile memory 100A to some degree. Data writing is then performed only once to the worn-out non-volatile memory 100A with application of the aforementioned intermediate potential as a gate voltage, thereby generating a great number of hot holes in an efficient manner.

[4] Other Modifications

Further, the present invention should by no means be limited to the above-illustrated embodiment, but various changes or modifications may be suggested without departing from the gist of the invention.

For instance, at each of the steps, S14, S34, and S54, a write operation is performed to the to-be-evaluated device only once. However, this invention should by no means be limited to this, and write/erase operations can be performed in repetition.

What is claimed is:

1. A method for evaluating a non-volatile memory, comprising the steps of:
   writing to the non-volatile memory at a lower temperature than a normal operation temperature so as to generate a greater number of hot holes than those to be generated by normal write/erase operation between a floating gate and a drain; and
   evaluating an operation of the non-volatile memory with respect to the hot holes while exposing the non-volatile memory to the normal operation temperature.

2. A method as set forth in claim 1, wherein said writing step at the lower temperature is performed at least once, after the normal write/erase operation is repeated a predetermined number of times at the normal operation temperature, so that a greater number of hot holes than those to be generated by the normal write/erase operation are generated.

3. A method as set forth in claim 2, wherein the non-volatile memory is placed in a low-temperature vessel to realize the lower temperature than the normal operation temperature.

4. A method as set forth in claim 1, wherein the non-volatile memory is placed in a low-temperature vessel to realize the lower temperature than the normal operation temperature.

5. A method for evaluating a non-volatile memory, comprising the steps of:
   writing to the non-volatile memory while applying an electrical potential, which belongs to a voltage range in which electron holes behave dominantly to induce an avalanche effect in memory cells, instead of a normal gate voltage to be applied at normal operation, as a gate voltage so as to generate a greater number of hot holes than those to be generated by normal write/erase operation between a floating gate and a drain; and
   evaluating an operation of the non-volatile memory with respect to the hot holes while exposing the non-volatile memory to a normal operation temperature.

6. A method as set forth in claim 5, wherein said writing step to the non-volatile memory with the electrical potential being applied as a gate voltage is performed at least once, after the normal write/erase operation to the non-volatile memory is repeated a predetermined number of times with the normal gate voltage being applied thereto, so that a greater number of hot holes than those to be generated by the normal write/erase operation are generated.

7. A method as set forth in claim 6, wherein gate voltage switching means, which is previously provided on the non-volatile memory for selectively applying one of the normal gate voltage and the electrical potential as a gate voltage, is used to apply the intermediate potential as a gate voltage, upon evaluation of the operation of the non-volatile memory with respect to the hot holes.

8. A method as set forth in claim 5, wherein gate voltage switching means, which is previously provided on the non-volatile memory for selectively applying one of the normal gate voltage and the electrical potential as a gate voltage, is used to apply the intermediate potential as a gate voltage, upon evaluation of the operation of the non-volatile memory with respect to the hot holes.

9. A method for evaluating a non-volatile memory, comprising the steps of:
   writing to the non-volatile memory at a lower temperature than a normal operation temperature while applying an electrical potential, which belongs to a voltage range in which electron holes behave dominantly to induce an avalanche effect in memory cells, instead of a normal gate voltage to be applied at normal operation, as a gate voltage so as to generate a greater number of hot holes than those to be generated by normal write/erase operation between a floating gate and a drain; and
   evaluating an operation of the non-volatile memory with respect to the hot holes while exposing the non-volatile memory to a normal operation temperature.

10. A method as set forth in claim 9, wherein said writing step to the non-volatile memory at the lower temperature, with the electrical potential being applied as a gate voltage, is performed at least once, after the normal write/erase operation to the non-volatile memory is repeated a predetermined number of times at the normal operation temperature, with the normal gate voltage being applied thereto, so that a greater number of hot holes than those to be generated by the normal write/erase operation are generated.

11. A method as set forth in claim 10, wherein the non-volatile memory is placed in a low-temperature vessel to realize the lower temperature than the normal operation temperature.

12. A method as set forth in claim 10, wherein gate voltage switching means, which is previously provided on the non-volatile memory for selectively applying one of the normal gate voltage and the electrical potential as a gate voltage, is used to apply the intermediate potential as a gate voltage, upon evaluation of the operation of the non-volatile memory with respect to the hot holes.

13. A method as set forth in claim 9, wherein the non-volatile memory is placed in a low-temperature vessel to realize the lower temperature than the normal operation temperature.

14. A method as set forth in claim 9, wherein gate voltage switching means, which is previously provided on the non-volatile memory for selectively applying one of the normal gate voltage and the electrical potential as a gate voltage, is used to apply the intermediate potential as a gate voltage, upon evaluation of the operation of the non-volatile memory with respect to the hot holes.

15. A non-volatile memory, comprising:
   a first power supply for applying a normal gate voltage at normal operation;
   a second power supply for applying an electrical potential, which belongs to a voltage range in which electron holes behave dominantly to induce an avalanche effect in memory cells, as a gate voltage, said second power supply being used, upon evaluation of operation of the non-volatile memory, to generate a greater number of hot holes than those to be generated by normal write/erase operation between a floating gate and a drain; and
   gate voltage switching means for selectively applying one of the normal gate voltage, which is generated by said first power supply, and the electrical potential, which is generated by said second power supply, as a gate voltage.

* * * * *